United States Patent
Ji et al.

(10) Patent No.: US 10,177,225 B2
(45) Date of Patent: Jan. 8, 2019

(54) ELECTRONIC COMPONENT AND MANUFACTURING METHOD THEREOF

(71) Applicant: MEDIATEK Inc., Hsin-Chu (TW)

(72) Inventors: Yan-Liang Ji, Hsinchu (TW);
Cheng-Hua Lin, Hsinchu (TW);
Puo-Yu Chiang, Yilan County (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 15/206,399

(22) Filed: Jul. 11, 2016

(65) Prior Publication Data

US 2017/0047398 A1 Feb. 16, 2017

Related U.S. Application Data

(60) Provisional application No. 62/204,156, filed on Aug. 12, 2015.

(51) Int. Cl.
| | |
|---|---|
| *H01L 29/06* | (2006.01) |
| *H01L 29/40* | (2006.01) |
| *H01L 29/78* | (2006.01) |
| *H01L 21/768* | (2006.01) |
| *H01L 23/535* | (2006.01) |
| *H01L 29/36* | (2006.01) |
| *H01L 29/423* | (2006.01) |

(52) U.S. Cl.
CPC .... *H01L 29/0653* (2013.01); *H01L 21/76895* (2013.01); *H01L 23/535* (2013.01); *H01L 29/36* (2013.01); *H01L 29/402* (2013.01); *H01L 29/404* (2013.01); *H01L 29/42356* (2013.01); *H01L 29/7835* (2013.01)

(58) Field of Classification Search
CPC combination set(s) only.
See application file for complete search history.

(56) References Cited

U.S. PATENT DOCUMENTS

| | | | |
|---|---|---|---|
| 4,614,959 | A | 9/1986 | Nakagawa |
| 7,737,524 | B2 | 6/2010 | Letavic |
| 9,231,105 | B2 | 1/2016 | Kume et al. |
| 2007/0080389 | A1* | 4/2007 | Petruzzello ........... B06B 1/0292 257/312 |
| 2013/0134512 | A1* | 5/2013 | Cheng .................. H01L 29/402 257/339 |

(Continued)

FOREIGN PATENT DOCUMENTS

WO 2005031876 A1 4/2005

OTHER PUBLICATIONS

EPO Search Report dated Jan. 3, 2017 in European application (No. 16181724.2-1552).

*Primary Examiner* — Ratisha Mehta
(74) *Attorney, Agent, or Firm* — McClure, Qualey & Rodack, LLP

(57) ABSTRACT

The electronic component includes a semiconductor substrate, a first doped region, a second doped region, a gate structure, a dielectric layer and a conductive portion. The semiconductor substrate has an upper surface. first doped region embedded in the semiconductor substrate. The second doped region is embedded in the semiconductor substrate. The gate structure is formed on the upper surface. The dielectric layer is formed above the upper surface and located between the first doped region and the second doped region. The conductive portion is formed on the dielectric layer.

16 Claims, 5 Drawing Sheets

(56) References Cited

U.S. PATENT DOCUMENTS

| | | |
|---|---|---|
| 2013/0341715 A1 | 12/2013 | McGregor |
| 2014/0231908 A1* | 8/2014 | Chen ................. H01L 29/66681 257/336 |
| 2015/0060875 A1 | 3/2015 | Kume et al. |
| 2015/0333141 A1* | 11/2015 | Liu .................... H01L 29/42364 257/76 |
| 2016/0149007 A1* | 5/2016 | Chou ................... H01L 29/402 257/339 |

* cited by examiner

ELECTRONIC COMPONENT AND MANUFACTURING METHOD THEREOF

This application claims the benefit of U.S. Provisional application Ser. No. 62/204,156, filed Aug. 12, 2015, the disclosure of which is incorporated by reference herein in its entirety.

FIELD OF THE INVENTION

The invention relates to an electronic component and a manufacturing method thereof, and more particularly to an electronic component having a conductive portion and a manufacturing method thereof.

BACKGROUND OF THE INVENTION

In conventional electronic component, a shallow trench isolations (STI) is embedded in a substrate and located a gate structure and a drain for increasing the endurance to voltage. However, the embedded STI increases the length between the gate structure and the drain, and it causes the impedance between the gate structure and the drain to increase.

Therefore, it is important how to reduce the impedance between the gate structure and the drain.

SUMMARY OF THE INVENTION

In one embodiment of the invention, an electronic component is provided. The electronic component includes a semiconductor substrate, a first doped region, a second doped region, a gate structure, a dielectric layer and a conductive portion. The semiconductor substrate has an upper surface. The first doped region is embedded in the semiconductor substrate. The second doped region is embedded in the semiconductor substrate. The gate structure is formed on the upper surface. The dielectric layer is formed above the upper surface and located between the first doped region and the second doped region. The conductive portion is formed on the dielectric layer.

In another embodiment of the invention, an electronic component is provided. The electronic component includes a semiconductor substrate, a first doped region, a second doped region and a conductive portion. The semiconductor substrate has an upper surface. The first doped region is embedded in the semiconductor substrate. The second doped region is embedded in the semiconductor substrate. The conductive portion is formed on the dielectric layer and located between the first doped region and the second doped region but not formed on any doped region between the first doped region and the second doped region.

In another embodiment of the invention, a manufacturing method of an electronic component is provided. The manufacturing method includes the following steps. A dielectric layer material is formed above an upper surface of a semiconductor substrate, wherein the dielectric layer material covers a gate structure formed on the upper surface; a portion of the dielectric layer material is removed, wherein another portion of the dielectric layer material is retained to form a dielectric layer, and the dielectric layer formed above the upper surface is located between the first doped region and the second doped region; a first doped region and a second doped region embedded in the semiconductor substrate are formed; and a conductive portion on the dielectric layer is formed.

In another embodiment of the invention, a manufacturing method of an electronic component is provided. The manufacturing method includes the following steps. A dielectric layer material is formed above an upper surface of a semiconductor substrate; wherein the dielectric layer material covers a gate structure formed on the upper surface; a portion of the dielectric layer material is removed, wherein another portion of the dielectric layer material is retained to form a dielectric layer; and the dielectric layer formed above the upper surface is located between the first doped region and the second doped region; a first doped region and a second doped region embedded in the semiconductor substrate are formed; and a conductive portion is formed on the dielectric layer, wherein the conductive portion is located between the first doped region and the second doped region but not formed on any doped region between the first doped region and the second doped region.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
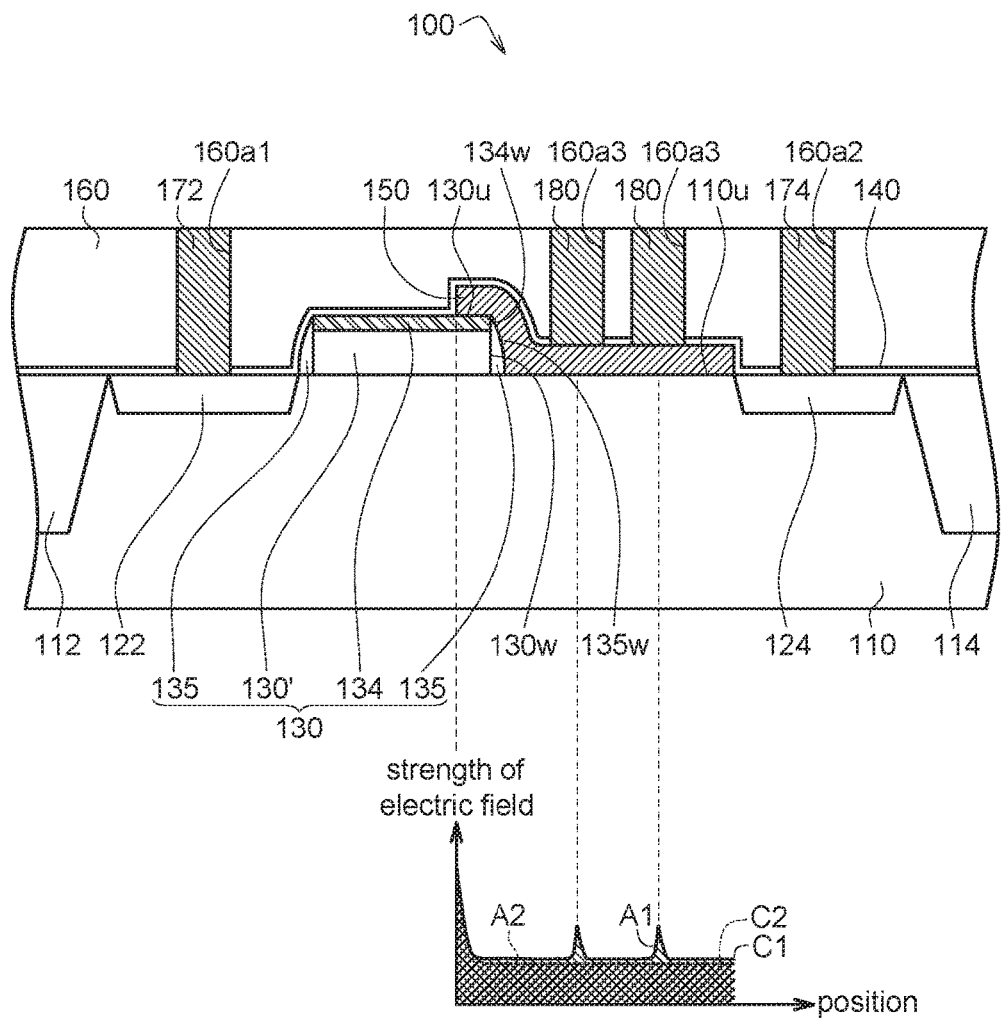
FIG. 1 illustrates a diagram of an electronic component according to an embodiment of the invention.

FIG. 1 illustrates a diagram of an electronic component 100 according to an embodiment of the invention. The electronic component 100 is, for example, a metal-oxide-semiconductor (MOS) structure.

The electronic component 100 includes a semiconductor substrate 110, a first isolation portion 112, a second isolation portion 114, a first doped region 122, a second doped region 124, a gate structure 130, a stop layer 140, a dielectric layer 150, a layer structure 160, a plurality of first contacts 172 and 174 and a least one conductive portion 180.

The semiconductor substrate 110 is, for example, silicon wafer. The semiconductor substrate 110 has an upper surface 110u. The first isolation portion 112 and the second isolation portion 114 are embedded in the semiconductor substrate 110 and located below the upper surface 110u. In an embodiment, the first isolation portion 112 and the second isolation portion 114 are shallow trench isolations (STI), for example.

The first doped region 122 and the second doped region 124 are embedded in the semiconductor substrate 110 and located below the upper surface 110u. The first doped region 122 and the second doped region 124 are located between the first isolation portion 112 and the second isolation portion 114. In an embodiment, the first doped region 122 and the second doped region 124 may be heavily doped regions, such as N-type heavily doped regions. Furthermore, the first doped region 122 and the second doped region 124 may be salicides. In an embodiment, one of the first doped region 122 and the second doped region 124 may be a source, and another of the first doped region 122 and the second doped region 124 may be a drain.

The gate structure 130 is formed on the upper surface 110u. The gate structure 130 includes a dielectric layer 130′, a gate 134 and a spacer 135. In an embodiment, the dielectric layer 130′ includes a first oxide layer, a nitride layer and a second oxide layer, wherein the nitride layer is formed between the first oxide layer and the second oxide layer. The first oxide layer, the nitride layer and second oxide layer may form an ONO structure. In another embodiment, the dielectric layer 130′ may be a single-layered structure. The gate 134 is formed on the dielectric layer 130. The spacer 135 is formed on a side all 130w of the ONO structure 130′ and a side all 134w of the gate 134. In another embodiment, the gate structure 130 may have other structure different from that of the gate structure 130 of FIG. 1.

The stop layer 140 covers the upper surface 110u of the semiconductor substrate 110, the gate structure 130 and the dielectric layer 150. The stop layer 140 may be made of a material such as nitride oxide.

The entire dielectric layer 150 is formed above the upper surface 110u of the semiconductor substrate 110 and located between the upper surface 110u and the stop layer 140. As a result, the dielectric layer 150 does not increase the length of the current path between the gate structure 130 and the second doped region 124 or may reduce the length of the current path between the gate structure 130 and the second doped region 124, and accordingly the impedance between the gate structure 130 and the second doped region 124 may be reduced.

The dielectric layer 150 is located between the first doped region 122 and the second doped region 124. As shown in FIG. 1, the dielectric layer 150 does not be formed on any doped region between the first doped region 122 and the second doped region 124. The dielectric layer 150 may be a blockage film that defines the regions of the first doped region 122 and the second doped region 124. In an embodiment, the dielectric layer 150 may be made of SiO, SiON, SiN or any insulator.

The dielectric layer 150 covers at least one portion of an upper surface 130u of the gate structure 130 and a lateral surface of the gate structure 130. For example, the dielectric layer 150 covers a portion of the lateral surface 135w of the spacer 135, and another portion of the lateral surface 135w of the spacer 135 is covered IT the stop layer 140. In another embodiment, the dielectric layer 150 may not cover the upper surface 130u of the gate structure 130 and/or the lateral surface 135w of the gate structure 130. In another embodiment, at least one portion of the spacer 135 may be omitted. Under such design, the dielectric layer 150 may be formed on the sidewall 130w of the ONO structure 130 and the sidewall 134w of the gate 134. In addition, the dielectric layer 150 has a thickness ranging between 500 angstrom and 2000 angstrom.

The layer structure 160 covers the stop layer 150. The layer structure 160 is, for example, an interlayer dielectric layer (ILD). The layer structure 160 has a first opening 160a1, a second opening 160a2 and at least one third opening 160a3.

The first opening 160a1 passes through the layer structure 160 and the stop layer 140 and is filled with the first contact 172, such that the first contact 172 connects to the first doped region 122 through the first opening 160a1.

The second opening 160a2 passes through the layer structure 160 and the stop layer 140 and is filled with the second contact 174, such that the second contact 174 connects to the second doped region 124 through the second opening 160a2.

The third openings 160a3 passing through the layer structure 160 and the stop layer 140 is filled with the conductive portion 180, such that the conductive portions 180 connect to the dielectric layer 150 through the third openings 160a3. In another embodiment, the third openings 160a3 may not pass through the stop layer 140, such that the conductive portions 180 connect to the dielectric layer 150 through the third openings 160a3.

The first contact 172, the second contact 174 and the conductive portion 180 may be formed in the same process, and accordingly the conductive portion 180 made of material may be the same as the first contact 172 and the second contact 174. The first contact 172, the second contact 174 and the conductive portion 180 may be made of metal.

As shown in FIG. 1, a first curve C1 represents a relationship between the position and the strength of electric field in the electronic component 100, and a second curve C2 represents a relationship between the position and the strength of electric field in a conventional electronic component without the dielectric layer 150 and the conductive portions 180. The integral area A1 of the first curve C1 is larger than the integral area A2 of the second curve C2, and accordingly the electronic component 100 may endure higher voltage than the conventional electronic component does.

Figure 2:
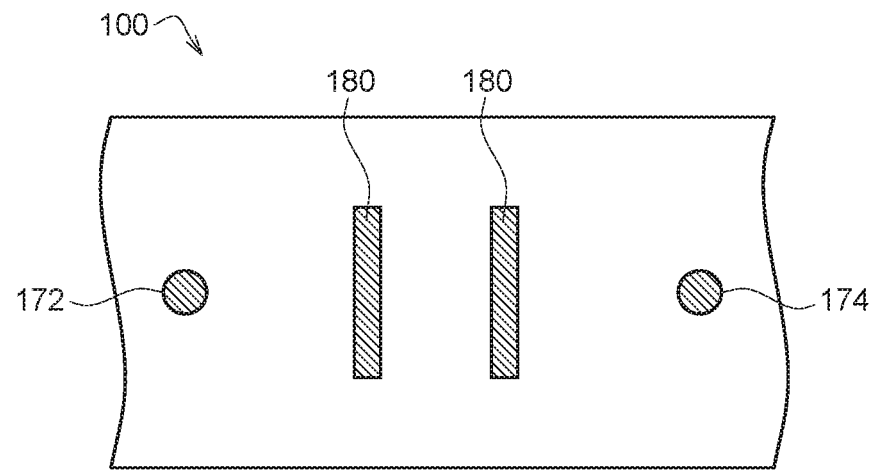
FIG. 2 illustrates a top view of the electronic component of FIG. 1.

FIG. 2 illustrates a top view of the electronic component 100 of FIG. 1. The number of the conductive portions 180 is plural and each conductive portion 180 extends in a stripe along the upper surface 110u. In another embodiment, the number of the conductive portions 180 may be single.

Figure 3:
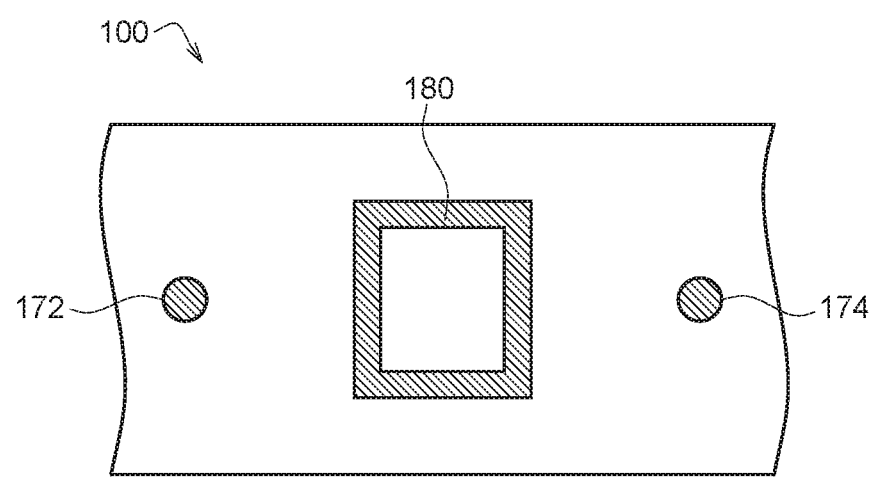
FIG. 3 illustrates a top view of the electronic component of FIG. 1 according another embodiment.

FIG. 3 illustrates a top view of the electronic component 100 of FIG. 1 according another embodiment. The number of the conductive portion 180 may be single and extends in a polygon along the upper surface 110u. In another embodiment, the number of the conductive portions 180 of FIG. 3 may be plural.

In other embodiment, the number of the conductive portions 180 may be single or plural, and at least one the conductive portions 180 extends in a curve, a straight line or combination thereof along the upper surface 110u.

FIGS. 4A to 4F illustrate manufacturing processes of the electronic component 100 of FIG. 1.

Figure 4A:
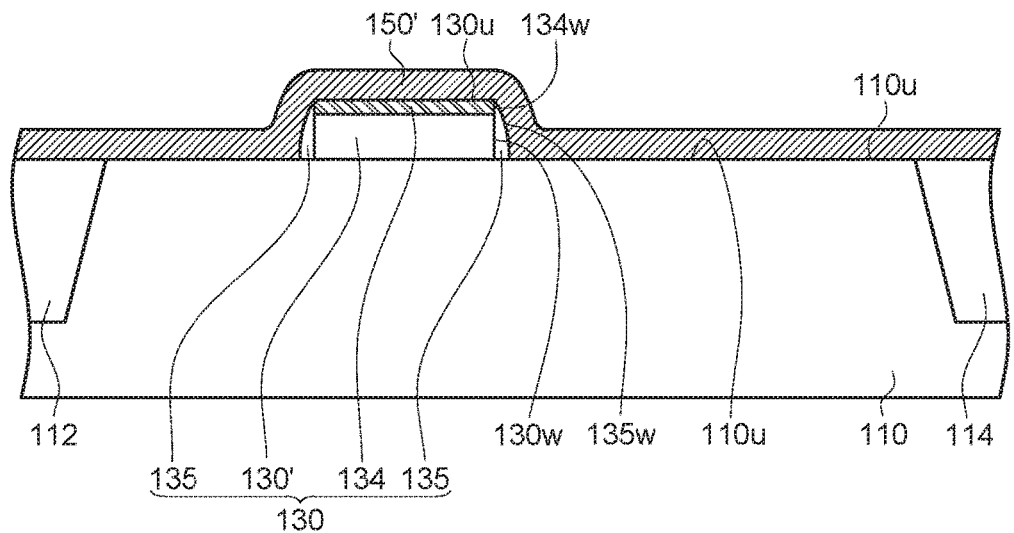
FIGS. 4A to 4F illustrate manufacturing processes of the electronic component of FIG. 1.

Referring to FIG. 4A, a dielectric layer material 150 covering the gate structure 130 is formed on the upper surface 110u of the semiconductor substrate 110.

The gate structure 130 includes a dielectric layer 130′, a gate 134 and a spacer 135. The gate 134 is formed on the dielectric layer 130′. The spacer 135 is formed on the sidewall 130w of the ONO structure 130 and the sidewall 134w of the gate 134. In another embodiment, the gate structure 130 may have other structure different from that of the gate structure 130 of FIG. 4A.

Figure 4B:
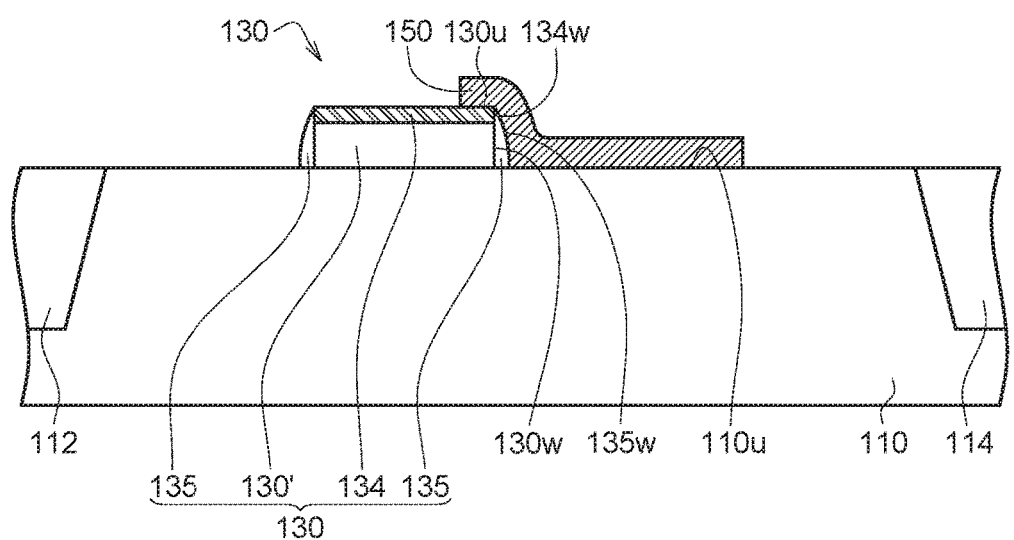

Referring to FIG. 4B, a portion of the dielectric layer material 150′ of FIG. 4A is removed, and another portion of the dielectric layer material 150′ is retained to form the dielectric layer 150. The dielectric layer 150 covers at least one portion of the upper surface 130u of the gate structure 130, at least one portion of the lateral surface 135w of the gate structure 130 and the upper surface 110u of the semiconductor substrate 110. The dielectric layer 150 is a blockage film that defines the regions of the first doped region 122 and the second doped region 124.

Figure 4C:
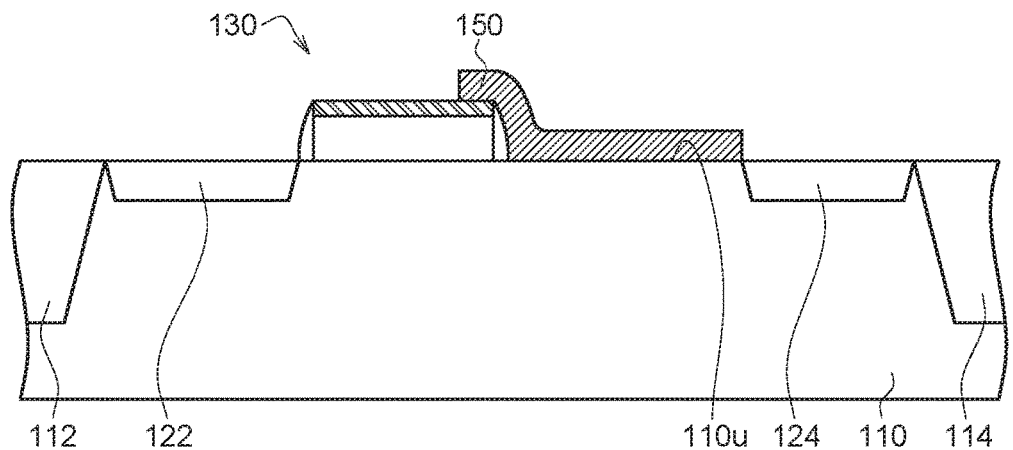

Referring to FIG. 4C, the first doped region 122 and the second doped region 124 are formed on the semiconductor substrate 110, wherein the first doped region 122 and the second doped region 124 are embedded in the semiconductor substrate 110.

Figure 4D:
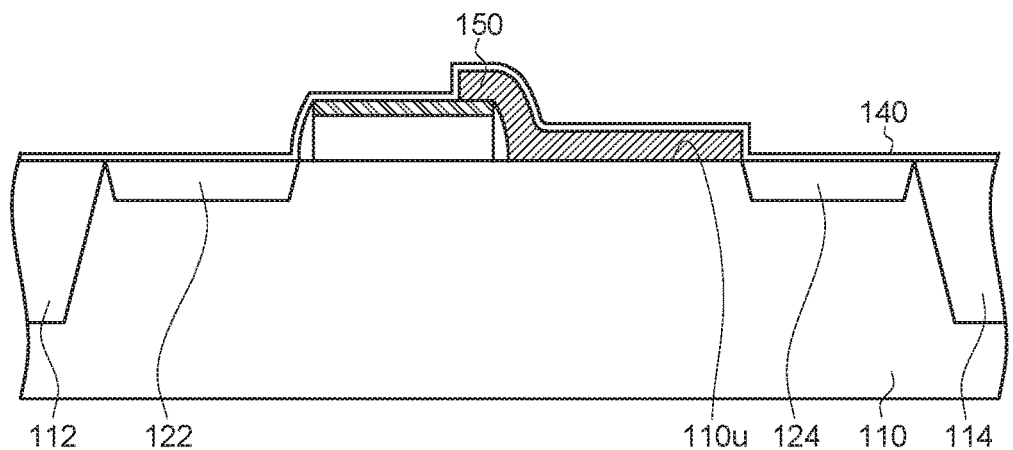

Referring to FIG. 4D, the stop layer 140 covering the upper surface 110u, the first isolation portion 112, the second isolation portion 114, the first doped region 122, the second doped region 124, the gate structure 130 and dielectric layer 150 is formed.

Figure 4E:
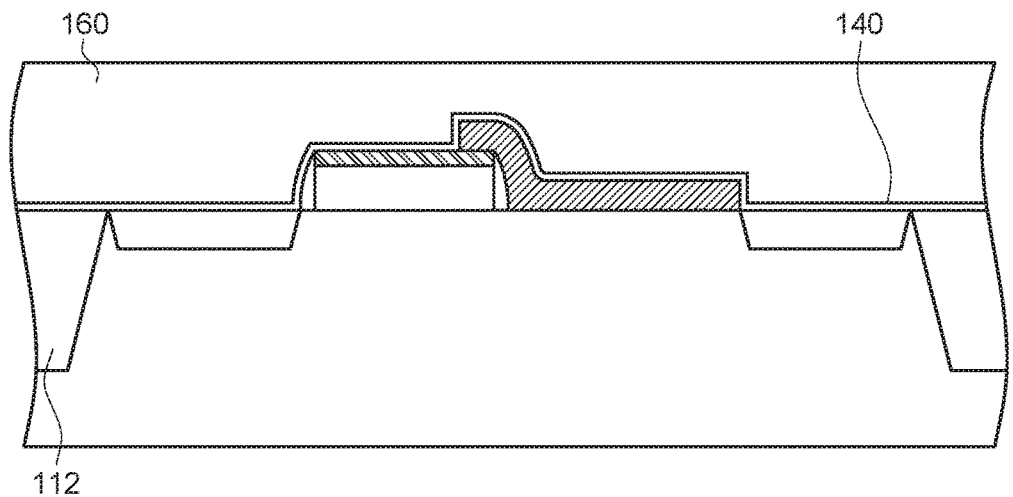

Referring to FIG. 4E, the layer structure 160 covering the stop layer 160 is formed. In an embodiment, the layer structure 160 is an interlayer dielectric layer, for example.

Figure 4F:
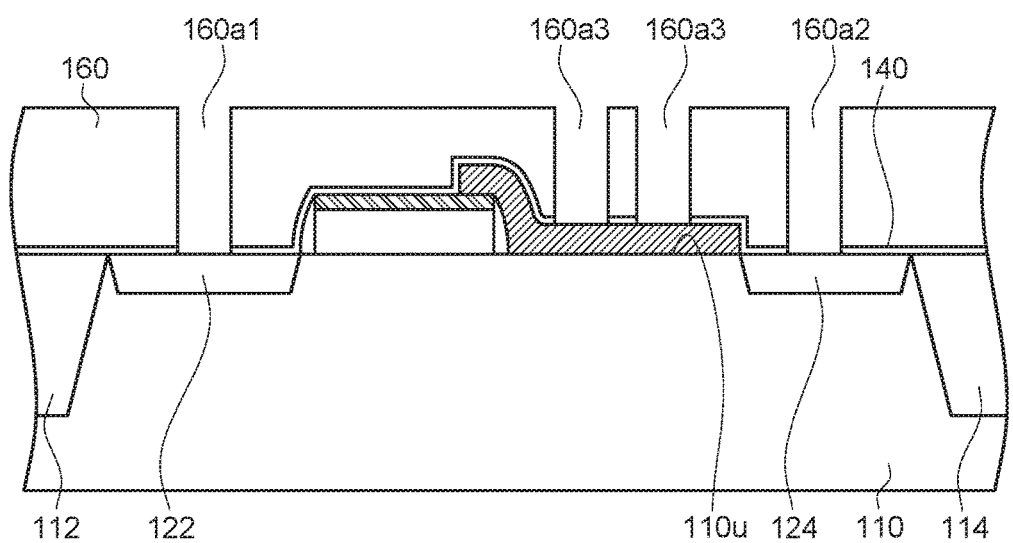

Referring to FIG. 4F, the first opening 160a1, the second opening 160a2 and the third openings 160a3 passing through the layer structure 160 and the stop layer 150 are formed.

Then, the first opening 160a1 is filled with the first contact 172 of FIG. 1, the second opening 160a2 is filled with the second contact 174 of FIG. 1 and the third openings 160a3 are filled with the conductive portions 180 of FIG. 1 in the same process to form the electronic component 100 of FIG. 1. The first contact 172, the second contact and the conductive portions 180 are made of the same material, such as metal.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic component, comprising:
    a semiconductor substrate having an upper surface;
    a first doped region embedded in the semiconductor substrate;
    a second doped region embedded in the semiconductor substrate;
    a gate structure formed on the upper surface;
    a dielectric layer formed above the upper surface and located between the first doped region and the second doped region;
    a conductive portion formed on the dielectric layer; and
    a layer structure surrounding the conductive portion;
    wherein an upper surface of the first doped region, an upper surface of the second doped region and a lower surface of the dielectric layer are substantially flush, and the conductive portion directly extends from the dielectric layer to an upper surface of the layer structure and is laterally spaced from the gate structure along an extension direction of the upper surface of the semiconductor substrate such that the conductive portion is disposed on the dielectric layer between the gate structure and the second doped region.

2. The electronic component as claimed in claim 1, further comprises:
    a first contact connecting to the first doped region; and
    a second contact connecting to the second doped region;
    wherein the conductive portion made of material is the same as that of the first contact and the second contact.

3. The electronic component as claimed in claim 1, wherein the gate structure has an upper surface and a lateral surface, and the dielectric layer covers the upper surface and the lateral surface of the gate structure.

4. The electronic component as claimed in claim 1, further comprises:
    a stop layer;
    wherein the dielectric layer is formed between the upper surface of the semiconductor substrate and the stop layer.

5. The electronic component as claimed in claim 1, wherein the conductive portion extends in a stripe along the upper surface.

6. The electronic component as claimed in claim 1, wherein the conductive portion extends in a polygon along the upper surface.

7. The electronic component as claimed in claim 1, wherein the conductive portion extends in a curve, a straight line or combination thereof.

8. The electronic component of claim 1, wherein:
    the conductive portion is a first conductive portion; and
    the electronic component further comprises a second conductive portion formed on the dielectric layer, the conductive portion directly extending from the dielectric layer to the upper surface of the layer structure and being laterally spaced from the first conductive portion along the extension direction of the upper surface of the semiconductor substrate such that the second conductive portion is disposed the dielectric layer between the first conductive portion and the second doped region.

9. The electronic component of claim 1, wherein the entire conductive portion is laterally spaced from the gate structure along an extension direction of the upper surface of the semiconductor substrate.

10. An electronic component, comprising:
    a semiconductor substrate having an upper surface;
    a first doped region embedded in the semiconductor substrate, wherein the first doped region has an upper surface;
    a second doped region embedded in the semiconductor substrate, wherein the second doped region has an upper surface;
    a conductive portion formed on a dielectric layer having a lower surface and located between the first doped region and the second doped region but not formed on any doped region between the first doped region and the second doped region; and
    a layer structure surrounding the conductive portion;
    wherein the upper surface of the first doped region, the upper surface of the second doped region and the lower surface of the dielectric layer are substantially flush, and the conductive portion directly extends from the dielectric layer to an upper surface of the layer structure and is laterally spaced from the gate structure along an extension direction of the upper surface of the semiconductor substrate such that the conductive portion is disposed on the dielectric layer between the gate structure and the second doped region.

11. The electronic component as claimed in claim 10, further comprises:
    a first contact connecting to the first doped region; and
    a second contact connecting to the second doped region;
    wherein the conductive portion made of material is the same as that of the first contact and the second contact.

12. The electronic component as claimed in claim 10, wherein a gate structure has an upper surface and a lateral surface, and the dielectric layer covers the upper surface and the lateral surface of the gate structure.

13. The electronic component as claimed in claim 10, further comprises:
    a stop layer;

wherein the dielectric layer is formed between the upper surface of the semiconductor substrate and the stop layer.

14. The electronic component as claimed in claim 10, wherein the conductive portion extends in a stripe along the upper surface.

15. The electronic component as claimed in claim 10, wherein the conductive portion extends in a polygon along the upper surface.

16. The electronic component as claimed in claim 10, wherein the conductive portion extends in a curve, a straight line or combination thereof.

* * * * *